US006280317B1

(12) United States Patent
Przilas et al.

(10) Patent No.: US 6,280,317 B1
(45) Date of Patent: Aug. 28, 2001

(54) METHOD AND APPARATUS FOR CONTROLLING AIRFLOW

(75) Inventors: Mark B. Przilas, Greenville; Robert H. Mimlitch, III, Rowlett, both of TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/097,892

(22) Filed: Jun. 16, 1998

(51) Int. Cl.⁷ ........................................................ H05K 5/00
(52) U.S. Cl. ................................. 454/184; 361/695
(58) Field of Search ........................... 454/184, 276; 361/695, 693, 818; 416/247 R

(56) References Cited

U.S. PATENT DOCUMENTS

| | | | |
|---|---|---|---|
| 3,364,838 | * 1/1968 | Bradley | 454/184 |
| 4,495,858 | * 1/1985 | Erickson | 361/384 |
| 4,702,154 | 10/1987 | Dodson . | |
| 4,724,747 | * 2/1988 | Sturm et al. | 454/184 |
| 5,006,959 | 4/1991 | Freige et al. . | |
| 5,171,183 | * 12/1992 | Pollard et al. | 454/184 |
| 5,210,680 | * 5/1993 | Scheibler | 361/384 |
| 5,460,571 | * 10/1995 | Kato et al. | 454/184 |
| 5,473,507 | 12/1995 | Schwegler et al. . | |
| 5,528,455 | 6/1996 | Miles | 361/688 |
| 5,576,931 | 11/1996 | Crane, Jr. et al. . | |
| 5,707,282 | 1/1998 | Clements et al. | 454/184 |
| 5,969,942 | * 10/1999 | Heckner et al. | 361/695 |

FOREIGN PATENT DOCUMENTS 297 23 505 U1  9/1998  (DE) .
0 895 448 A2  2/1999  (EP) .

OTHER PUBLICATIONS

Hammer et al., "Ventilation System for Data Process Systems," IBM Technical Disclosure Bulletin, 17(9):2529–2530, Feb., 1975.

(List continued on next page.)

*Primary Examiner*—Harold Joyce
*Assistant Examiner*—Derek S. Boles
(74) *Attorney, Agent, or Firm*—Baker Botts L.L.P.

(57) ABSTRACT

Airflow patterns from fans and centrifugal blowers that force air into cardcages may be very irregular and unpredictable. Because the amount of cooling provided by fans and centrifugal blowers is based directly upon the velocity of air over the components of the circuit cards within the cardcages, irregular airflow patterns may lead to unreliable operation of circuit cards due to inadequate cooling. In a broad aspect, the present invention comprises a system for controlling the temperatures of circuit cards in cardcages or other enclosures by controlling the flow of air. More particularly, the invention comprises mechanical flow diverters which may divert, deflect, channel or otherwise re-distribute the flow of air to attain a generally common or consistent rate of flow past each circuit card in a cardcage. The invention may be assembled as a discrete part and attached either to the fan, cardcage or other support structure or the invention can be an integral part of the cardcage. The invention maximizes cooling efficiency by modifying the cooling air distribution based on actual requirements and these requirements are proportional to the local heat flux and/or device temperature limits.

28 Claims, 14 Drawing Sheets

OTHER PUBLICATIONS

PCT Search Report, Oct. 13, 1999.

Capstone Electronics brochure entitled: "AUGAT® VME Packaging,".

Carlo Gavazzi, Inc. brochure entitled: "System Packaging Products,".

Electronic Solutions 1992 Catalog enetitled: "System Packaging,".

MATRIX Rugged Technology brochure entitled: "Battling Harsh Environments," 1995 VMEbus Catalog.

Schroff® 1987/1988 Catalog entitled: "Electronic Enclosures Microprocessor Packaging Systems,".

VECTOR Electronic Company brochure entitled: "System Packaging & Prototype Products,".

VERO Electronics 1997 Handbook.

Brochure entitled: "Introducing FAB–RAK™ The Fabricated Steel CompactPCI™ Subrack that Cuts Costs without Tradeoffs," Carlo Gavazzi, Inc.

FAB–RAK from the Internet at: http://www.gavazzi–mu-pac.com/fabrak.htm.

* cited by examiner

FAN BLAST AREA SUPERIMPOSED ON BOTTOM OF CARDCAGE AIR ENTRANCE AREA

SLOT 1, COMPONENT SIDE VIEW

SLOT 3 OR 4, COMPONENT SIDE VIEW

SLOT 6, COMPONENT SIDE VIEW

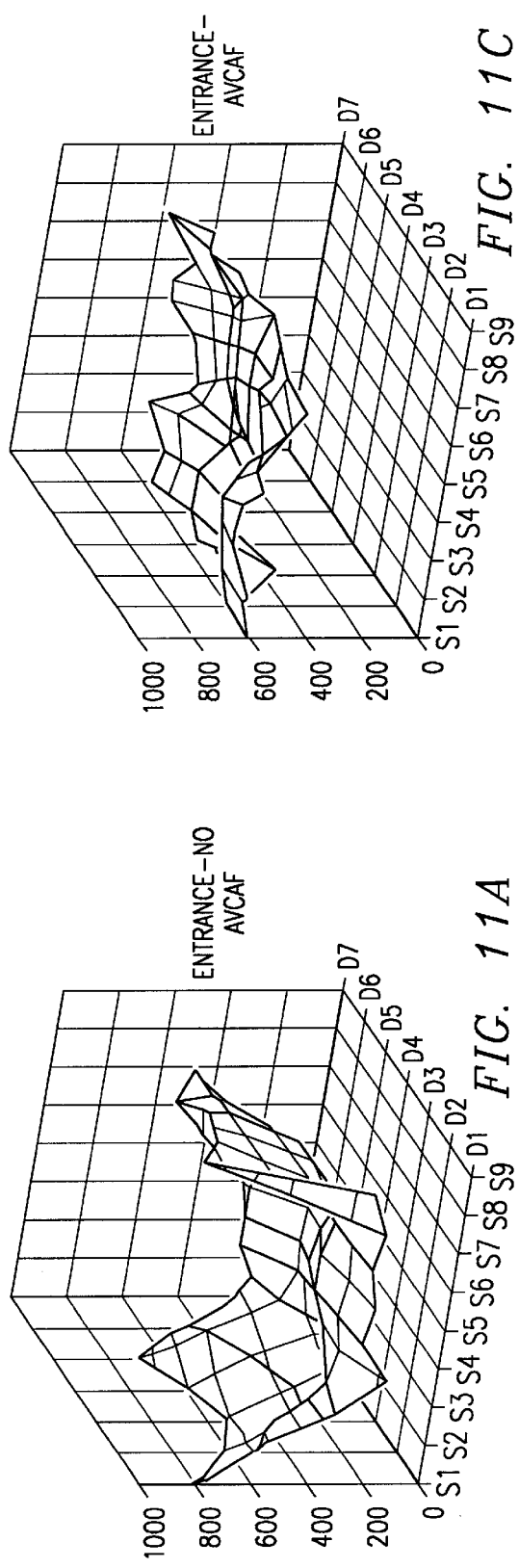
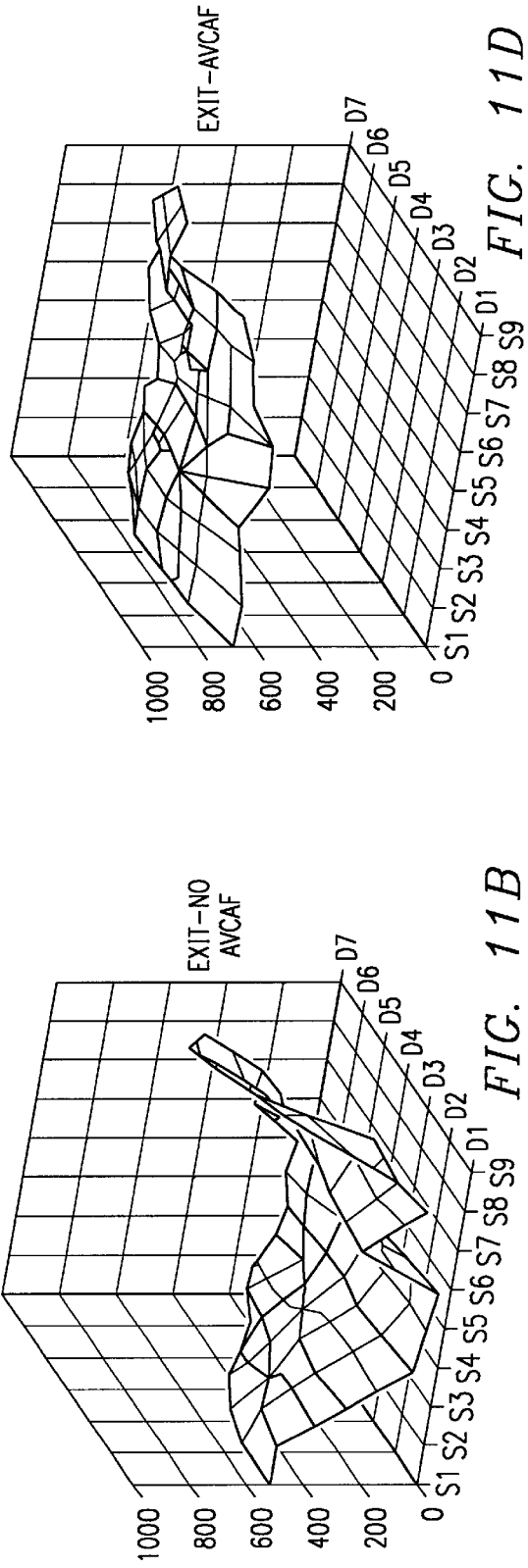
FIG. 11A  ENTRANCE-NO AVCAF
FIG. 11B  EXIT-NO AVCAF
FIG. 11C  ENTRANCE-AVCAF
FIG. 11D  EXIT-AVCAF

METHOD AND APPARATUS FOR CONTROLLING AIRFLOW

TECHNICAL FIELD

The present invention relates generally to the forced convection cooling of circuit card assemblies and associated electronic components. More particularly, the invention relates to an improved method and apparatus for controlling and distributing airflow within circuit card arrays, which results in improved cooling of circuit card assemblies contained in electronic enclosures.

BACKGROUND OF THE INVENTION

Electronic components and integrated circuit packages are often mounted on printed circuit cards creating an electronic assembly of irregularly shaped packages bonded to a planer surface. Multiple circuit card assemblies may be placed into an array (referred to as a cardcage) within an enclosure, thereby maximizing the packaging volume efficiency. Several types and configurations of enclosures with the ability to support various numbers of circuit cards are readily available for connecting the circuit card assemblies into a cardcage. Standard bus architectures have been defined for these card enclosures. For example, the VME bus standard (ANSI/IEEE Std. 1014-1987) has been defined for the electrical backplane bus interface for circuit card enclosures. Other bus standards include the VME64 Standard, which revises the VME bus standard into a 64-bit architecture, and the VXI ("VME extensions for Instrumentation") bus, which is designed to allow low level signals to co-exist on a backplane with high speed digital and RF or microwave signals.

As circuit cards are being developed with greater electronic component density per card, and electronic components continue to operate at higher frequencies and increased power, the cooling of circuit card assemblies in these electronic enclosures becomes more critical for proper operation of these electronic components. Electronic components that operate above recommended thermal constraints may not operate reliably, causing circuit cards to prematurely fail due to thermal stress. The problems associated with overheating of electronic components may be intensified in applications that require circuit card assemblies to operate in harsh environments, such as heavy industrial or military applications.

Traditionally, the cooling of circuit card assemblies in electronic enclosures has been performed by placing fans or blowers at the entrance or exit of an electronic enclosure and forcing air across the circuit card assemblies within a cardcage. The amount of cooling provided by this method is based directly upon the velocity, temperature, and atmospheric pressure of the air flowing over electronic components. Therefore, it is the responsibility of electronic enclosure designers to meet the cooling requirements specified by electronic component and circuit board manufacturers.

However, generally speaking, the cooling requirements specified by electronic component and circuit board manufacturers are incomplete or improperly applied as discussed below. In addition, there is no consistent method used by manufacturers to define cooling requirements. Two general approaches are to specify (1) the maximum component temperature or (2) the maximum operating environmental conditions. The first approach, however, fails to recognize that all components have internal and surface thermal gradients present. Therefore, when specifying the maximum component temperature, the specific location as to where to measure this temperature must be referenced. This detailed information is not generally provided by device manufacturers and is very difficult to obtain from technical representatives. Similarly, when specifying the maximum operating environmental conditions that a circuit card or component can operate in, the manufacturer should identify several parameters. These parameters include air temperature, air velocity profiles, and atmospheric pressure conditions. Manufacturers will generally define the air temperature and mass flow rate requirements. However, no consideration is given to the airflow profile, or it is assumed to be uniform, which is rarely the case. Many times the maximum component temperature is incorrectly assumed to be the same as the maximum air temperature.

Because the cooling requirements specified by electronic component and circuit board manufacturers are often incomplete, testing the components and circuit boards is the simplest way to determine actual cooling requirements. These tests require techniques that can measure device surface temperatures without interrupting the air velocity profile. In addition, these techniques must include a means to measure the air velocity profiles and correlate this data to the measured device surface temperatures. Finally, the techniques must correlate device surface temperatures and air velocity profiles with inlet air temperatures and atmospheric conditions.

In addition to the specifications defined by component and circuit card manufacturers, electronic enclosure manufacturers specify the cooling performance of an electronic enclosure based on an average volumetric flow of air for a single slot within a cardcage. To meet the cooling requirements as specified by the electronic component manufacturers, electronic enclosure designers have traditionally selected a fan or blower with an overall volumetric flow rate that, when divided by the number of slots in a cardcage, meets the specified average flow rate specified for each circuit card assembly. This average flow rate is assumed to be uniformly distributed across each slot in the cardcage and across each of the various electronic components on each circuit card assembly. For example, when designing an electronic enclosure system with six circuit card assemblies in a standard VME cardcage enclosure, the selected fan must provide an average volumetric airflow six times the required volumetric airflow at the circuit card assemblies. The volumetric airflow requirements are derived from the electronic component manufacturers' airflow velocity requirements at the device. If the electronic components require an airflow velocity of 300 linear feet per minute at the device surface, then an overall volumetric flow rate across the circuit card assembly can be derived based on an estimated cross-sectional area between each circuit card assembly within the array. An estimated cross-sectional area between standard 6U-VME circuit card assemblies is 2.5 square inches (0.4"×6.0"); therefore, the average volumetric flow rate required across each circuit card assembly is 5 cubic feet per minute. Traditional electronic enclosure manufacturers would select a fan or blower that provides six times the average volumetric flow rate for a single circuit card assembly or 30 cubic feet per minute of total flow for the enclosure.

This design method, however, fails to recognize that fans and blowers do not provide uniform flow rate to all circuit card assemblies, nonetheless uniform airflow to the electronic components on each circuit card assembly within the cardcage. Further, this method fails to recognize that a single value for the volumetric flow rate for each circuit card assembly or each electronic component on a circuit card assembly is not adequate to describe the actual cooling requirements for an entire array of circuit cards within an electronic enclosure or even a single circuit card assembly within the cardcage. In addition, this method fails to recognize that there are pressure drops associated with airflow restrictions in the electronic enclosure system. Board and enclosure designs reduce the airflow delivered by the fans. Therefore, any attempt to provide a more uniform airflow must be done without significantly increasing the flow resistance within the enclosure. Additional pressure drops can quickly reduce the amount of air received, and while the air may be uniform, it may be of such low velocities that is negates any improvement in cooling.

It has been recognized that axial fans, centrifugal blowers, and other airflow sources do not provide uniform airflow rates to all of the slots or components on circuit cards within a cardcage. This problem is compounded when different components on a given circuit card assembly or different locations within the cardcage have different cooling requirements. The problem may further be compounded if some of the slots do not contain circuit card assemblies.

Some cardcages have been designed in an attempt to improve cooling under these circumstances. For example, some VXI cardcages provide a mechanical baffle to close the inlet to unused card slots. Other VME cardcages have used slot "blocker" cards to reduce the airflow through unused slots in the cardcage. Although these designs provide some improvement to the problems associated with meeting cooling requirements, these designs do not attempt to provide uniform airflow to all components and circuit card assemblies in a cardcage. Nor do they attempt to control the airflow directly from an airflow source in order to provide cooling at specific locations of a circuit card assembly in a cardcage.

Therefore, a continuing need exists for controlling airflow in a cardcage such that airflow can be provided at specific locations in the cardcage to ensure that each device receives sufficient airflow. Especially needed is a more uniform flow profile wherein air or another gas flows in a pattern within a cardcage such that a circuit board's device temperatures are independent of the boards location within the cardcage. Uniform airflow is essential to proper and adequate cooling of the cards. Proper and adequate cooling, in turn, is essential to the reliable and effective operation of the cards.

SUMMARY OF THE INVENTION

The present invention provides an improved method and apparatus for controlling airflow direction and magnitude in an electronic enclosure and specifically across circuit card assemblies. In a broad aspect, the invention comprises a system for controlling the temperatures of circuit cards in a cardcage or other enclosure by controlling the flow of air within the cardcage array. The resulting cooling improvements and the sum of the embodiments are referred to as the Advanced Vector Controlled Air Flow System or AVCAF System. The invention results in part from the recognition and analysis of the airflow through a cardcage. Thus, it has been determined that the airflow patterns in cardcages may be very irregular and unpredictable. It has also been determined that past practices for selecting an airflow source to provide airflow for cooling have provided inefficient or inadequate designs. These failures are due, at least in part, to the failure of others to recognize the basic origins of the problems and how to analyze and solve these problems.

It has been determined in some instances that the flow rate of air may vary from one circuit card slot to the next and from the leading edge of a card to the trailing edge in a cardcage. It has also been found that the flow rates through the central or core portion of an array of cards, as well as along the extreme boundaries of the array, may be lower than through the intermediate portions. In some instances, the airflow in some portions may actually reverse flow direction.

The present invention broadly comprises a system for altering the pattern of air flowing from an airflow source before it enters a cardcage to form a pattern of greater airflow uniformity. More particularly, the invention comprises mechanical flow diverters which may divert, deflect, channel or otherwise re-distribute the flow of air to attain a generally common or consistent rate of flow past each circuit card.

The invention in another broad aspect comprises one or more flow diverters positioned between the source of a gas flow and a cardcage or other enclosure to modify the flow patterns within the overall enclosure to help attain a desired thermal flow pattern. It is recognized that this aspect of the invention may require an approach which may be empirical in part. Thus, more than one temperature and flow rate survey may be required with resulting flow diverter modifications to attain a desired airflow pattern.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 6 illustrate the air velocities vectors entering and flowing through Slot 6, located to the right side of a fan.

FIGS. 11A and FIG. 11B graph test data of airflow velocities produced at the entrance and exit of a typical cardcage by an axial flow fan located at the entrance of the cardcage.

FIGS. 11C and FIG. 11D graph test data of airflow velocities produced at the entrance and exit of a typical cardcage by the axial flow fan used in FIG. 11A–FIG. 11B after the addition of an airflow diverter.

DESCPTION OF ILLUSTRATIVE EMBODIENTS

The present invention improves the cooling performance of forced air convection cooled electronic circuit card assemblies. The improved cooling results from techniques that control and improve the distribution of the cooling medium through the cardcage. The application of such techniques requires a thorough understanding of application specific cooling requirements, typical airflow profiles of fans, cardcage designs, and airflow restrictions of electronic enclosure systems.

A variety of techniques may be used for determining the uniquely irregular flow patterns of gas from an axial fan, centrifugal blower, or other airflow source, through a cardcage. A hand held test probe may be configured to measure the airflow velocity and temperature at various points within a cardcage. In other cases, a specially designed test probe card assembly in conjunction with a data monitoring system may be used to measure the airflow velocity at various points within a cardcage. Also, a thermal imaging system, such as a Thermovision 900 camera produced by AGEMA Infrared Systems, may be used to measure the temperature variations within a cardcage. Based on a rule-of-thumb, and assuming a uniform board heat flux, hotter areas within the cardcage tend to indicate a reduced airflow rate within a specific region while cooler areas within the cardcage tend to indicate a higher airflow rate within a region.

Figure 1:
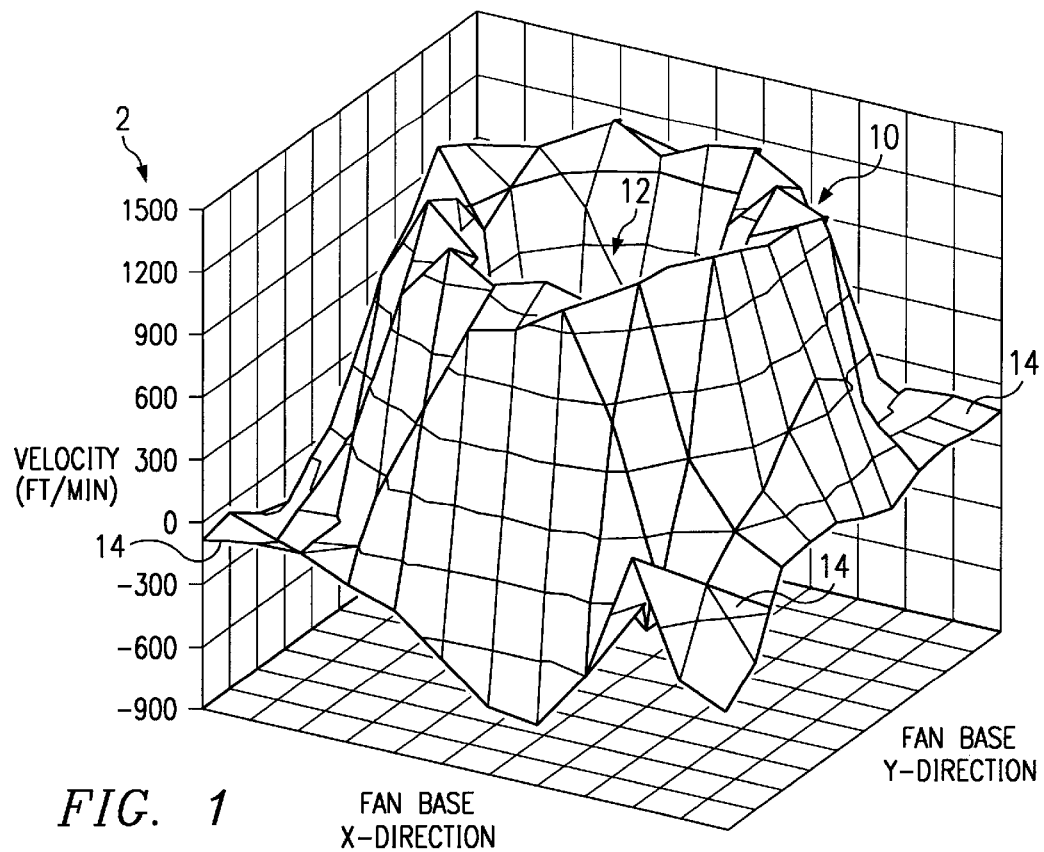
FIG. 1 graphs the cross sectional airflow profile within a rectangular duct having no circuit card assemblies or other obstruction at a location of one inch downstream of an axial flow fan.

Before one can understand how air flows through complex cardcages with circuit boards, a baseline for simple duct airflow must be established. First, consider how an axial flow fan moves air through a single duct with no dividers that has approximately the same cross sectional area as the fan. The single duct with no dividers accurately represents a simple cardcage with no circuit boards installed. FIG. 1 is a cross sectional velocity profile that occurs in a rectangular duct one inch downstream of the fan. The z-axis 2 represents the airflow velocity measured in feet per minute. This test data may be obtained using the previously described techniques to measure the velocity of air. As seen in FIG. 1, the blast area of the fan results in an annular ring 10 of high velocities. This annular ring 10 coincides with the blade area of the fan. The velocity vectors in this region are not parallel to duct walls, but rather they form a conical vortex. The air moves through the duct in a corkscrew fashion. As illustrated in FIG. 1, the hub area of the fan creates a very low velocity region 12 downstream from the fan hub. The direction of the low velocities in the region 12 can be either toward or away from the fan depending upon the fan geometry, the structure supporting the fan, and the downstream pressure field. Similarly, the corner regions 14 of the duct also have very low velocities and may have airflow in either direction.

Figure 2:
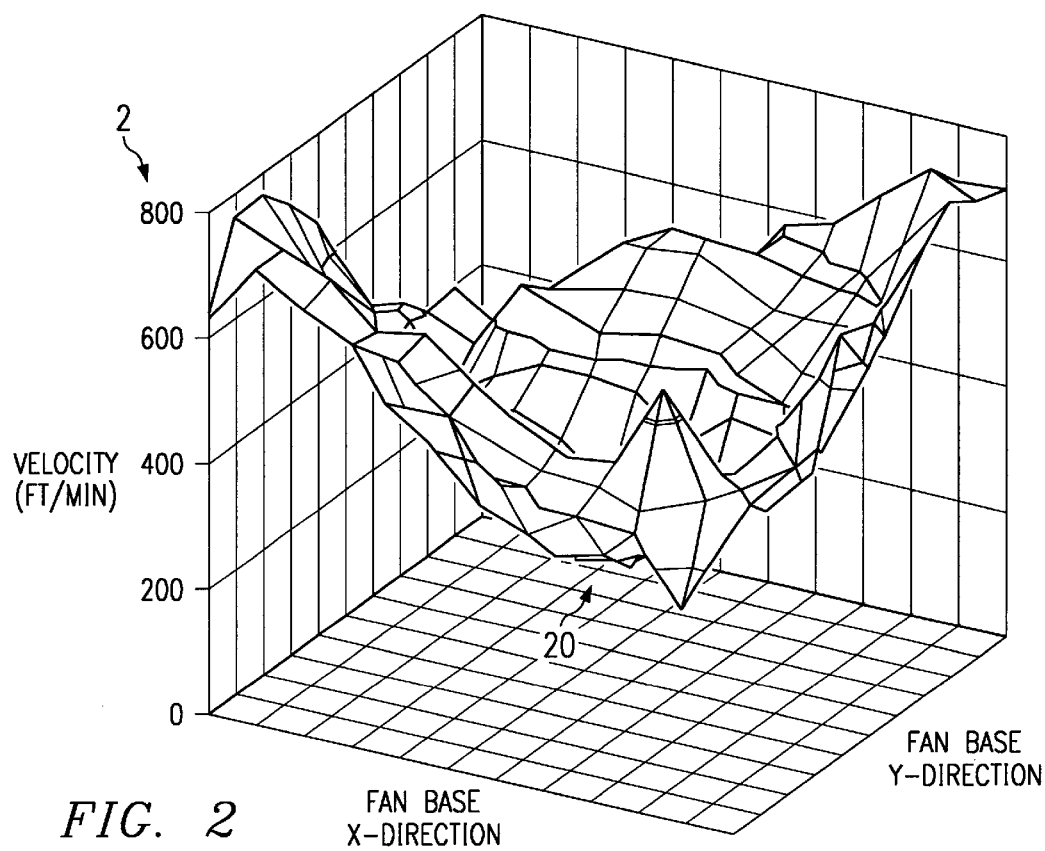
FIG. 2 graphs the cross sectional airflow profile within a rectangular duct having no circuit board assemblies or other obstruction at a location of nine and one-half inches downstream of an axial flow fan.

FIG. 2 illustrates the airflow profile nine and one half inches from the fan in the rectangular duct discussed in relation to FIG. 1. As illustrated in FIG. 2, the flow profile within the rectangular duct does not reach a uniform magnitude even nine and one half inches from the fan. A low velocity region 20 is still clearly visible downstream from the fan hub. Many commercial electronic enclosure manufacturers have traditionally thought that the non-uniform flow produced by axial fans would more evenly distribute as down-stream flow profiles develop. As this figure illustrates, however, the "twisting" rotational vectors that created the annular ring effects may begin to dissipate at nine and one half inches down stream, but airflow remains extremely non-uniform.

Figure 3:
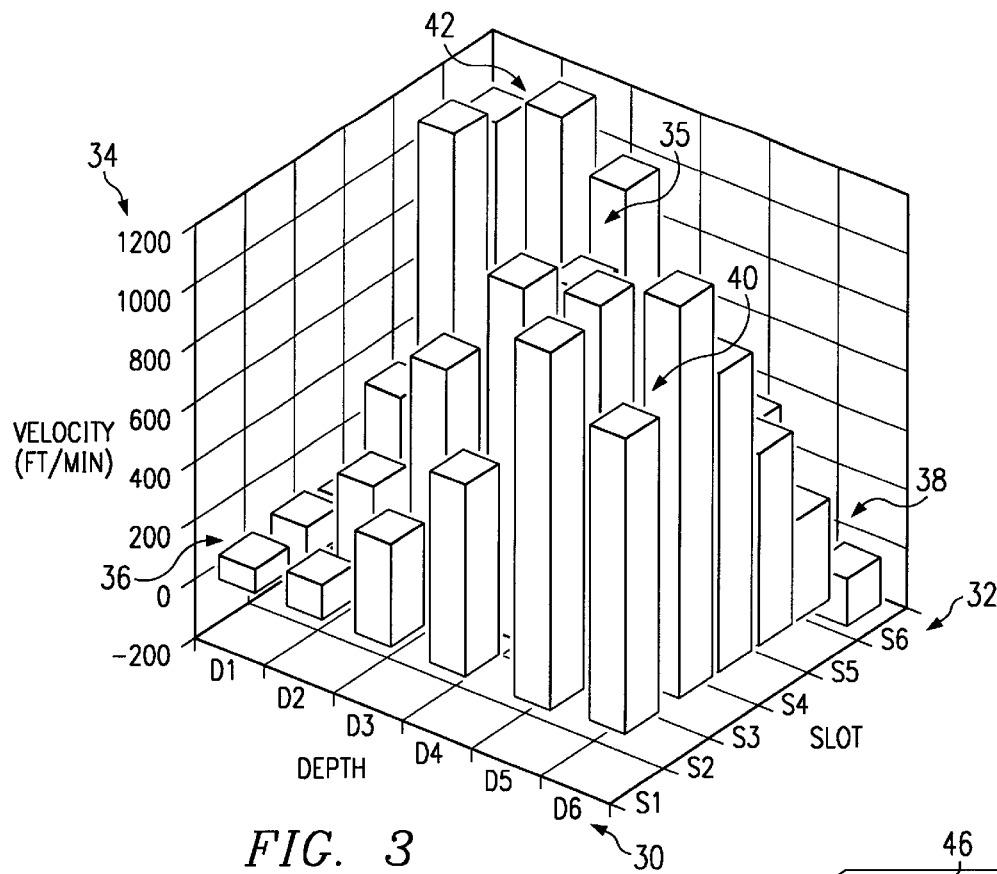
FIG. 3 graphs the cross sectional airflow profile within an array of six parallel rectangular ducts having the same net cross sectional area as the duct in FIG. 1.

Although enclosure manufacturers believe that the installation of circuit cards into the cardcage improves the flow distribution, the airflow non-uniformity is actually compounded. FIG. 3 is an airflow profile graph that illustrates the dramatic change that occurs in the cross sectional velocity profile when the single rectangular duct is modified and segmented into an array of six smaller rectangular ducts. The airflow profile is graphed based on the nomenclature and coordinate system identified with respect to FIG. 4.

The wall thickness of the smaller rectangular ducts is approximately 0.80 inch. This condition is similar to placing six circuit boards with no components into the cardcage. The combined cross sectional area of the six ducts is approximately the same as the initial single duct. The static pressure of the single duct and the six parallel ducts is approximately the same. As a result, the same amount of air flows thorough the parallel ducts as in the single duct. However, the profile of the air is very different. As can be seen in FIG. 3, the hub area 35 and two opposing corners of the cardcage 36 and 38 remain a low flow region, while the two remaining corners 40 and 42 have very high velocity profiles. These profiles result from the corkscrew vortex produced by the axial fan. The resulting non-uniform flow distribution is typical of most commercially available enclosure products.

Figure 4:
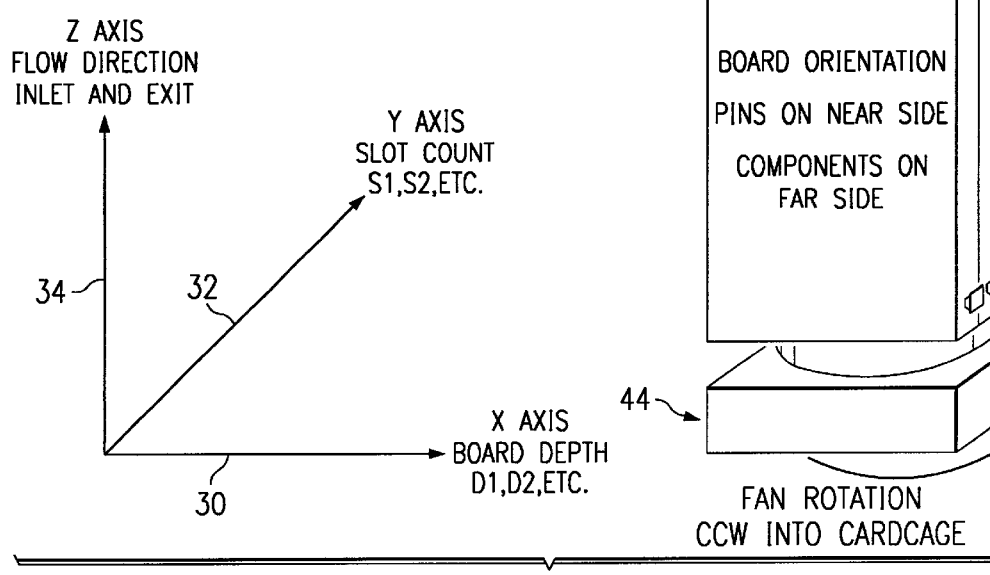
FIG. 4 schematically illustrates the nomenclature and axis orientation with respect to the fan, cardcage, and circuit boards.

FIG. 4 helps identify the coordinate system and nomenclature used to graph airflow from a fan 44 located under and flowing into a cardcage 46. The x-axis 30 is in alignment with the direction in which a circuit board is inserted into the cardcage. The origin is at the backplane of the cardcage and is positive as one moves toward the circuit board front panel. Relative distances between the cardcage backplane and circuit board front panel are identified by a D prefix, for example D1, D2, D3, etc. The y-axis 32 is aligned with the cardcage backplane. The origin is at slot 1 on the backplane and is positive as one moves from left to right. This corresponds with slot numbering, S1, S2, S3, etc. The z-axis 34 is in the direction of the airflow from the fan into the cardcage and represents the measured airflow in feet per minute at the corresponding slot and depth in the cardcage.

Figure 5:
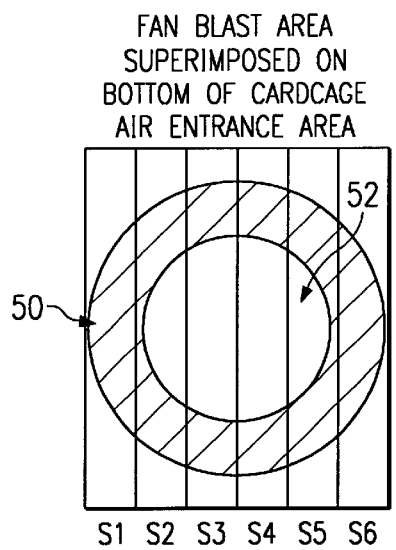
FIG. 5 illustrates the fan blast area with respect to the cardcage inlet.

FIG. 5 illustrates how the blast air, i.e. the airflow exiting the fan, from an axial fan is distributed across the cardcage slots shown in FIG. 4. The blast area 50 is the area that coincides with the blade area of the fan. The primary airflow from an axial fan is to the blast area 50. The hub area 52 is the area that coincides with a fan hub. This area does not typically receive a significant amount of blast air from an axial flow fan. The following table lists each slots respective blast area for a given fan with a blast area having a 2.2 inch inside diameter and a 4.5 inch outside diameter. Slots 2 and 4 see more of the blast area and therefore receive more airflow. Slot 1 and 6 not only have the most skewed air, but also see the least blast area.

| Slot | Blast Area | Percentage of Total Blast Area |
|---|---|---|
| Slot 1 | 1.42 in$^2$ | 11.7% |
| Slot 2 | 2.70 in$^2$ | 22.3% |
| Slot 3 | 1.93 in$^2$ | 16.0% |
| Slot 4 | 1.93 in$^2$ | 16.0% |
| Slot 5 | 2.70 in$^2$ | 22.3% |
| Slot 6 | 1.42 in$^2$ | 11.7% |

Figure 6:
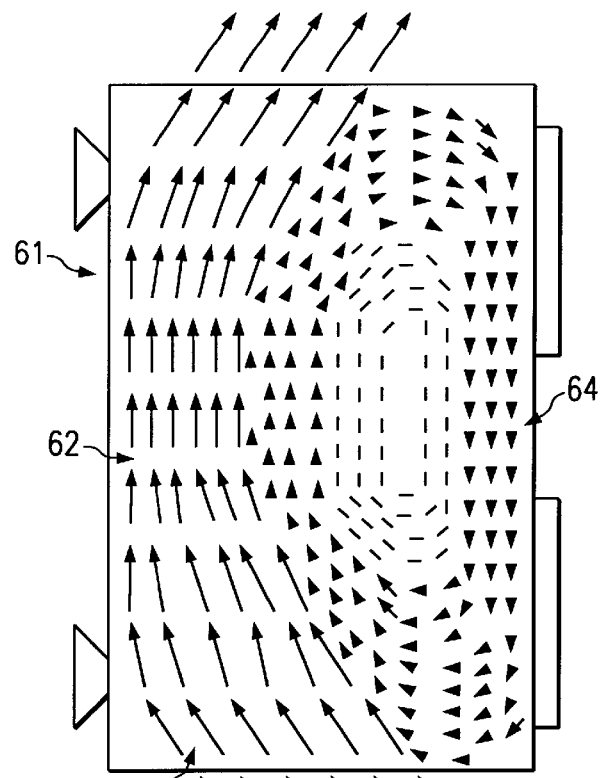
FIG. 6. illustrates the air velocities vectors entering and flowing through Slot 1, located to the left side of a fan.
Figure 7:
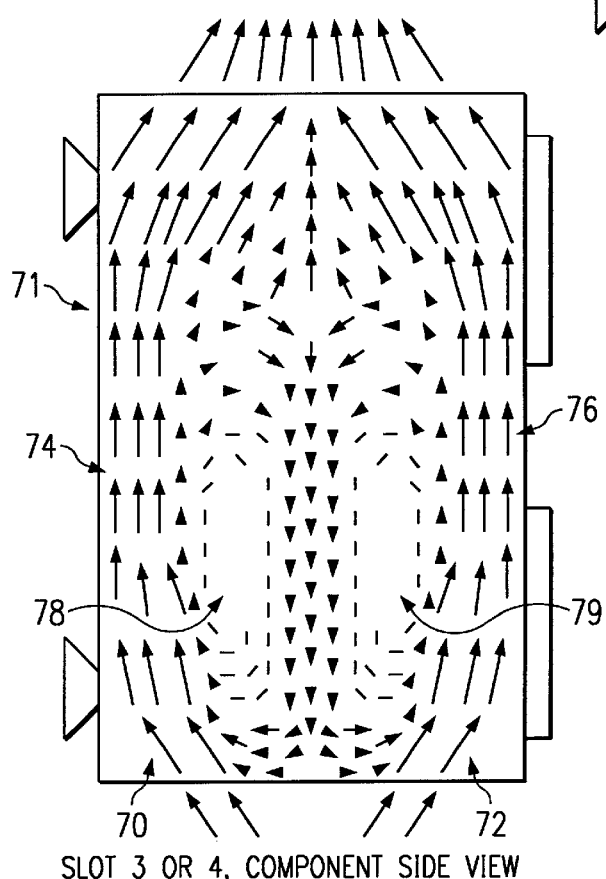
FIG. 7 illustrates the air velocities vectors entering and flowing through Slots 3 or Slot 4, located at the center of a fan.
Figure 8:
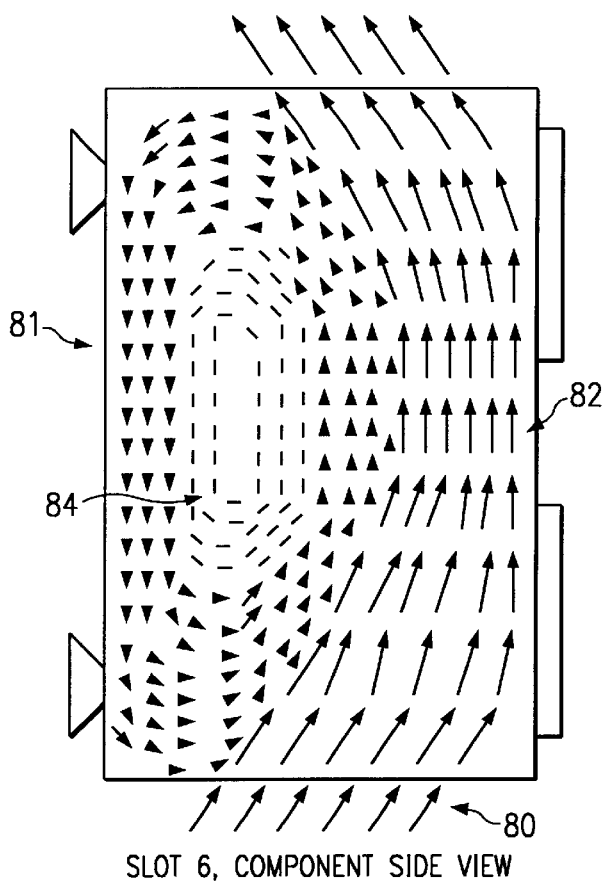

FIGS. 6–8 illustrate the air velocity vectors entering and flowing through the parallel ducts of the six rectangular ducts discussed in relation to FIG. 3. A fan is provided that rotates counter-clock-wise as shown in FIG. 4.

FIG. 6 illustrates the inlet velocity vectors across a circuit card 61 inserted at slot 1, which is located to the left side of the fan. Maximum velocities occur near the center region 60 of the entrance of slot 1. The vectors are skewed to the left and into the page. This air will impact the components of the circuit card 61. The bulk of the air will flow up the left region 62 of the duct and a low velocity recirculation area 64 will form on the right side. Additional recirculation areas may form in the top and bottom corners of the duct depending upon the geometric configuration of the cardcage.

FIG. 7 illustrates the inlet velocity vectors across a circuit card 71 inserted at slots 3 and 4, which are located near the center of the fan. Two regions of maximum velocities, regions 70 and 72, will form. These coincide with the blast area created by the fan blades. The high velocity inlet vectors near the front panel region 70 are skewed to the left and out of the page. This air will impact the pin side of the next adjacent board in a cardcage. Air from this region 70 will flow up the left region 74 of the duct. The high velocity inlet vectors near the backplane connector region 72 are skewed to the right and into the page. This air will impact the components on the board in this slot. Air from the region 72 will flow up the right region 76 of the duct. Two low velocity recirculation areas 78 and 79 will form directly above the hub area. The distance that these eddies extend above the fan depends on geometry and fan speed. Additional recirculation areas may form in the top and bottom corners of the duct depending upon the geometric configuration of the cardcage.

FIG. 8 illustrates the inlet velocity vectors across a circuit card 81 inserted at slot 6, which is located to the right side of the fan. The airflow illustrated in FIG. 8 is a mirror image of the airflow in FIG. 6. Maximum velocities occur near the center region 80 of the entrance. The vectors are skewed to the right and out of the page. This air will impact the cardcage side walls. The bulk of the air will flow up the right region 82 of the duct and a recirculation area 84 will form on the left side. Additional low velocity recirculation areas may form in the top and bottom corners of the duct depending upon the geometric configuration of the cardcage.

In alternate systems, the fan rotation direction may be changed. In these alternate systems, FIG. 8 will represent slot 1 velocity and FIG. 6 will represent slot 6. The inlet vectors will be into the page for slot 1 and out of the page for slot 6. For slots 3 and 4, illustrated in FIG. 7, the inlet vectors near the front panel will be into the page, while the inlet vectors near the backplane connector P2 will be out of the page.

Figure 9:
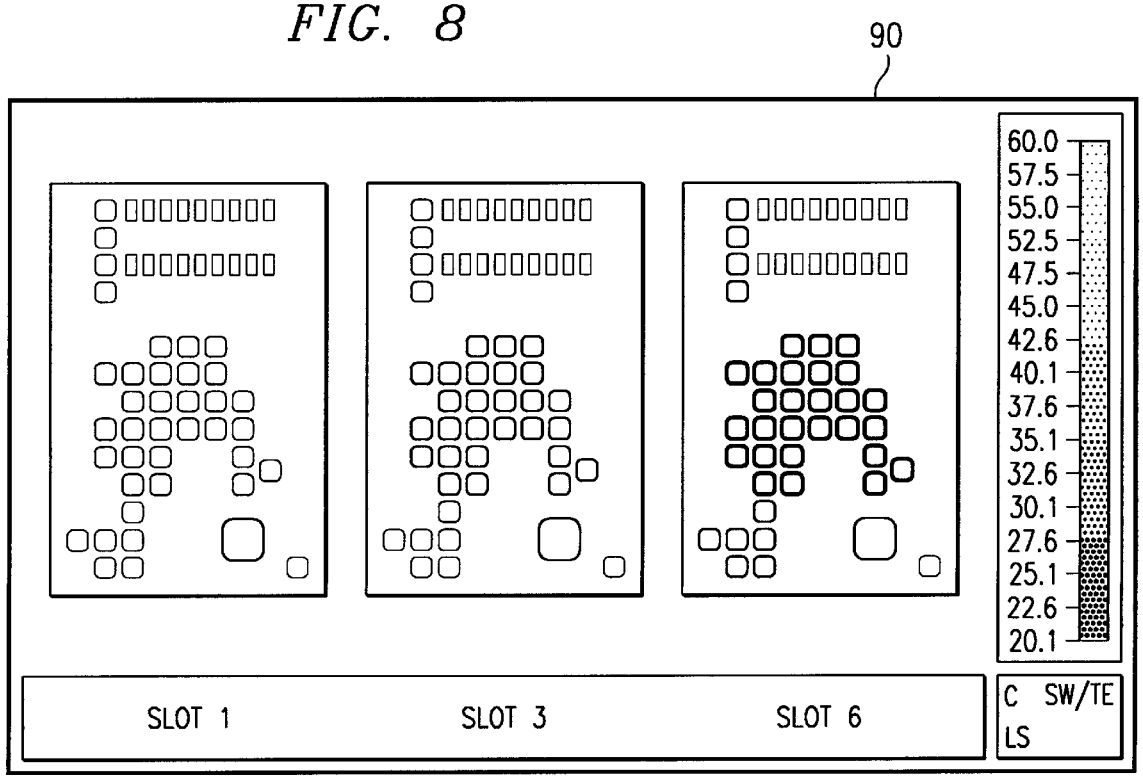
FIG. 9 plots infrared test data as a function of board location relative to the fan.

FIG. 9 illustrates three infrared images of the same circuit board installed in slot 1, slot 3, and slot 6 of a cardcage with an axial fan as discussed in relation to FIG. 3. A temperature scale 90 is provided that ranges between 20° C. and 60° C. Hotter operating regions are represented by lighter shading and cooler operating regions are represented by darker shading. In each infrared image, the circuit board was allowed to operate until steady state operating temperatures were reached. The inlet air temperature was the same for all three images. These results clearly indicate the significant impact of the various velocity profiles illustrated in FIG. 6, FIG. 7, and FIG. 8. The maximum device temperature changes by 20° C. as the card is moved from slot to slot. The life of electronics, as estimated using the Arrhenius Function, is doubled by operating it 10° C. cooler or halved by operating it 10° C. hotter. Therefore, the life of a circuit board can be doubled simply based on the slot in a cardcage it is placed in and the resulting air velocity profile.

To address the problems associated with poor airflow in circuit card enclosures, the present invention provides various design methods and apparatus to redirect, divert, channel, deflect, or otherwise redistribute airflow from an airflow source to create a more balanced flow within the slots of a cardcage. In particular, various types of airflow diverters are provided for altering airflow.

FIG. 10, FIG. 11, and FIG. 12 illustrate the airflow profile improvements that can be made by understanding the initial velocity vectors and then redirecting the velocity vectors using the airflow diverters of the present invention. FIG. 10 and FIG. 11 illustrate the improvements for axial fans, while FIG. 12 illustrates the improvements for a duplex blower.

Figure 10A:
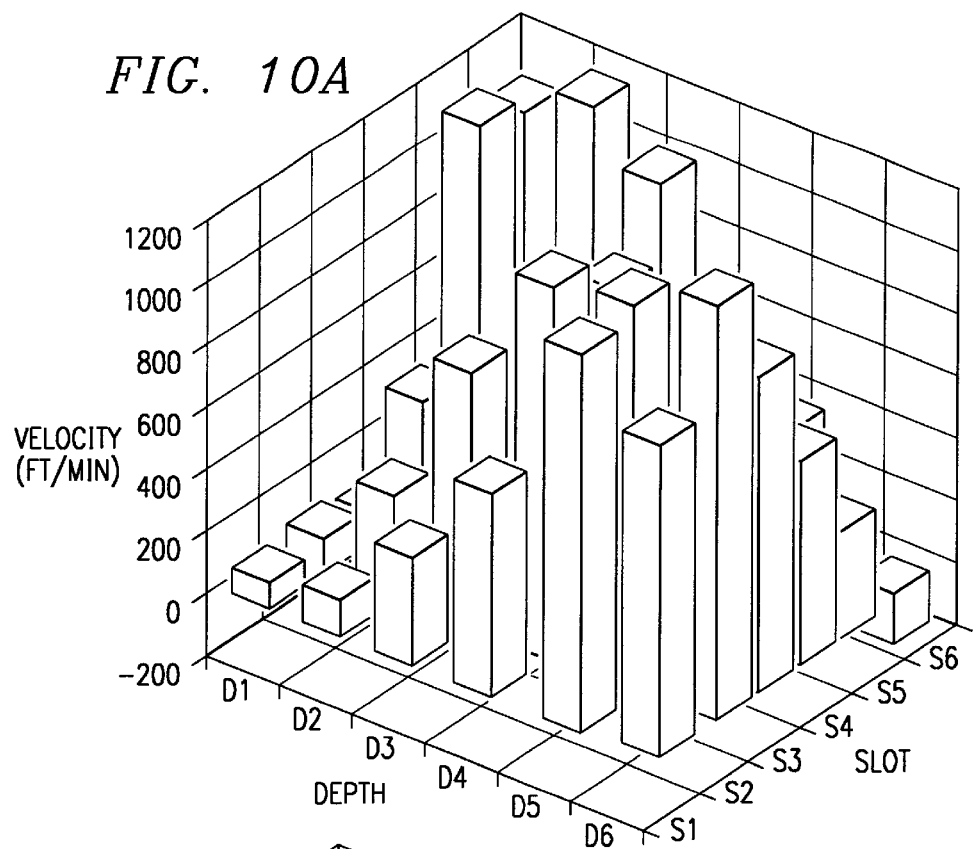
FIG. 10A graphs test data of airflow velocities produced from an axial flow fan located at the entrance of a typical cardcage.
Figure 10B:
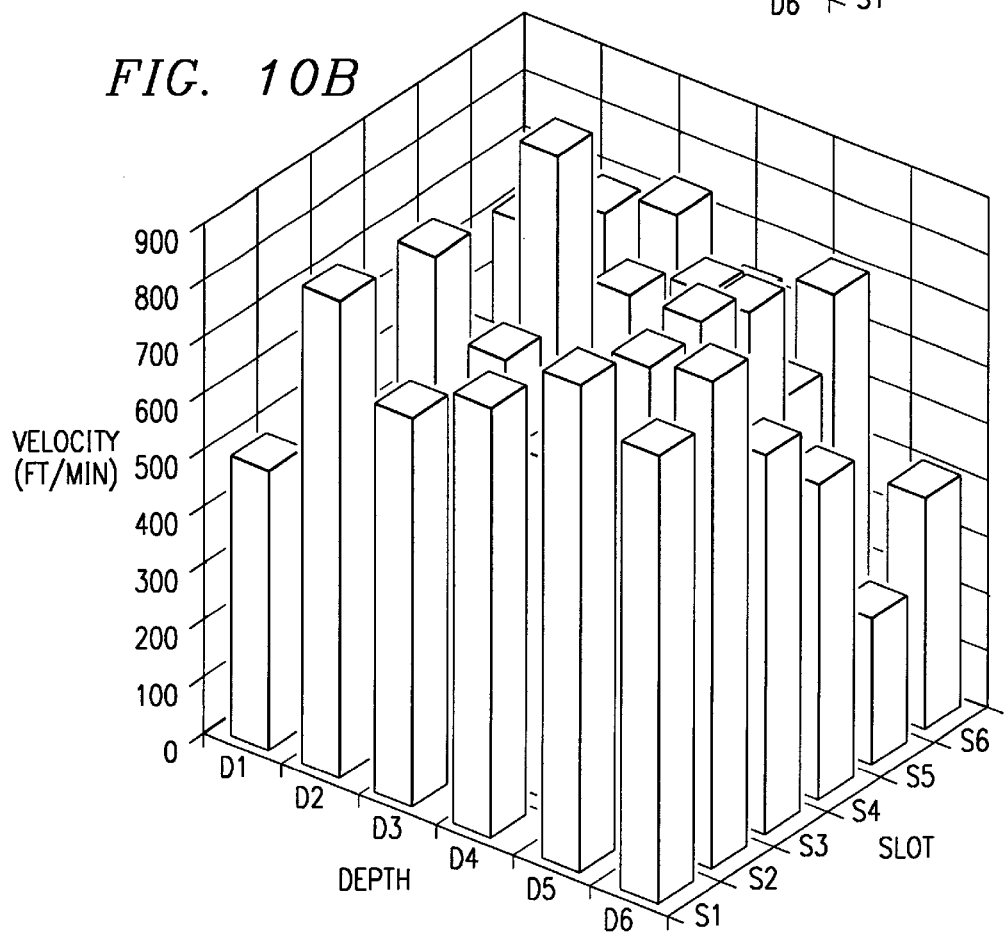
FIG. 10B graphs test data of airflow velocities produced from the axial flow fan used in FIG. 10A after the addition of an airflow diverter.

FIG. 10A graphs the test data of airflow velocities produced from an axial fan as described with relation to FIG. 3. The air flow path was straight into a fan and directly into the cardcage and straight out of the cardcage. There were no additional restrictions due to the enclosure geometry at either the entrance or the exit. FIG. 10B graphs the improvements provided by selecting an appropriate diverter for providing uniform airflow. The results shown were collected while using the diverter shown in FIG. 14A. Similar results would be obtained from diverters shown in FIG. 20 and FIG. 22.

Similarly, FIG. 11A, FIG. 11B, FIG. 11C, and FIG. 11D illustrate the improvements obtained using an embodiment of the diverter of the present invention in a 9-slot VME card cage mounted in a ¾ ATR chassis. The initial air flow path was restricted at the enclosure inlet duct due to poor enclosure design features. The air flow path was straight into a fan and directly into the cardcage and straight out of the cardcage. There were no significant restrictions due to the enclosure geometry at the exit. FIG. 11A illustrates the entrance airflow profile of a cardcage using an axial fan. FIG. 11B illustrates the exit airflow profile of an axial fan. FIG. 11C and FIG. 11D illustrate the improved uniform airflow at the entrance and exit of the cardcage provided by selecting an appropriate diverter and increasing the inlet duct slightly. The diverter shown in FIG. 20 was installed during the data collection.

Figure 12A:
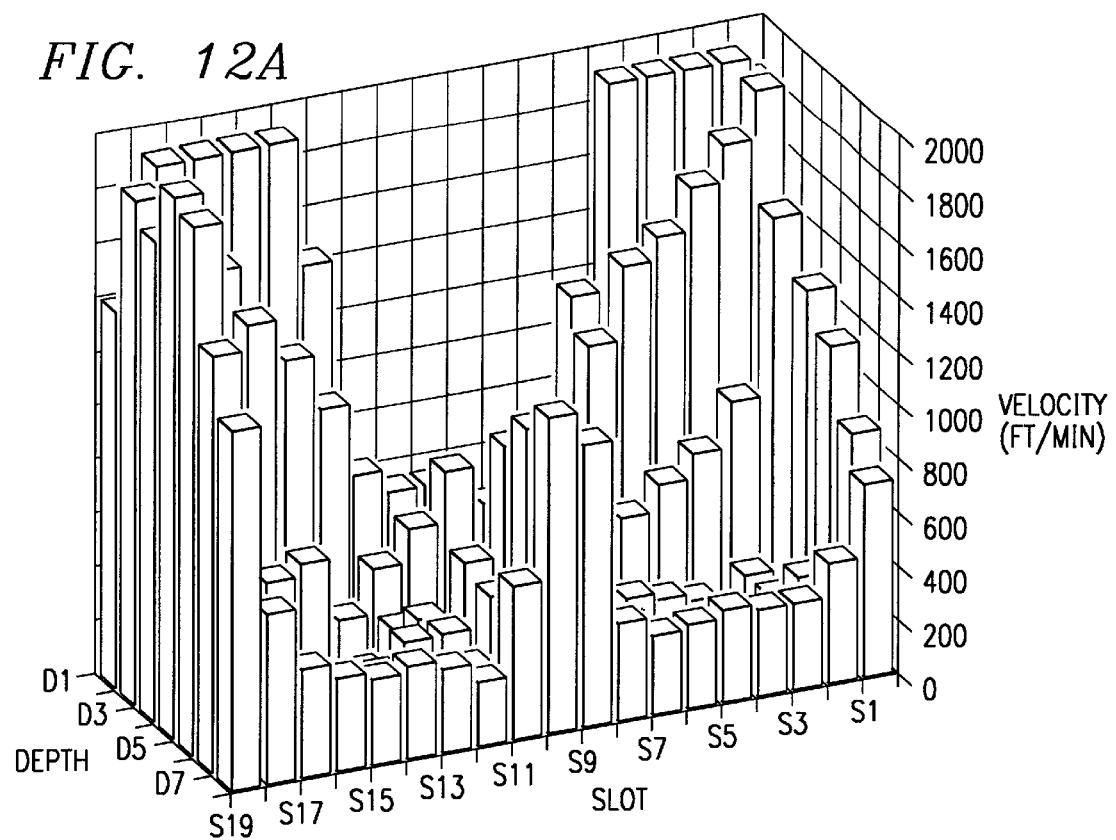
FIG. 12A graphs test data of airflow velocities within a typical cardcage produced by a duplex blower located at the entrance of the cardcage.
Figure 12B:
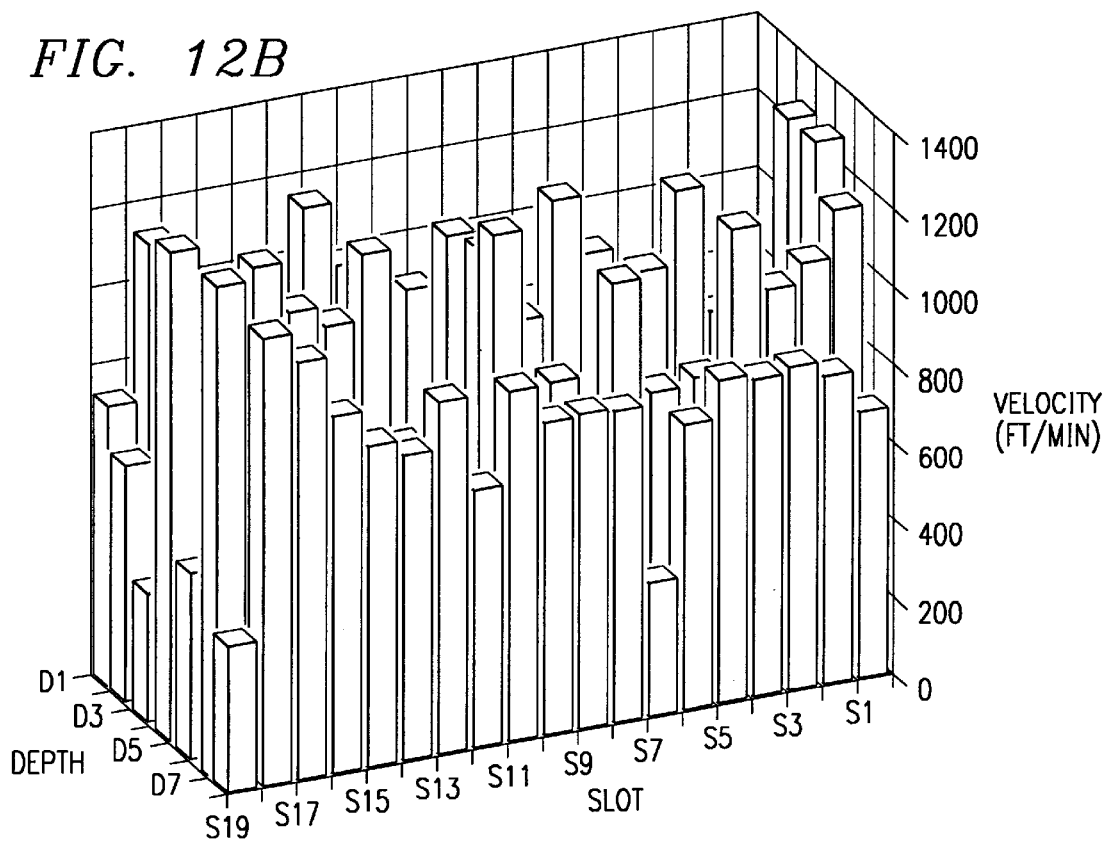
FIG. 12B graphs test data of airflow velocities within a typical cardcage produced by the blower used in FIG. 12A after the addition of an airflow diverter.

FIG. 12A and FIG. 12B illustrate the improvements obtained for a cardcage mounted in a 19" rack mount chassis, using a duplex centrifugal blower and a U-shaped air flow path. The U-shaped airflow path was created by causing air to exit the blower and turn ninety degrees to enter the cardcage. The airflow then was turned ninety degrees after exiting the top of the cardcage. The cardcage fit in the enclosure such that there was one and one-half inches above and below the cardcage. This distance has a significant impact on how air enters and exits the cardcage. FIG. 12A illustrates a non-uniform airflow profile with the cardcage. By introducing an embodiment of the airflow diverter of the present invention, the improved airflow shown in FIG. 12B may be obtained. The diverter shown in FIG. 18 was utilized to collect the data in FIG. 12B.

It should be understood that the embodiments described in relation to FIGS. 10, 11, and 12 are merely for illustration purposes. The present invention may be used to alter airflow patterns in any size and shaped cardcage. For example, the present invention may be used with the cardcage described in co-pending U.S. patent application Ser. No. 09/098,040, entitled "An Improved Cardcage for Circuit Cards," which was filed on the same day as the present application and is incorporated herein by reference. Further, it should readily be understood that the selection of an appropriate diverter may require an empirical approach in which more than one temperature and flow rate survey may be required with resulting flow diverter modifications to attain a desired airflow pattern.

Figure 13:
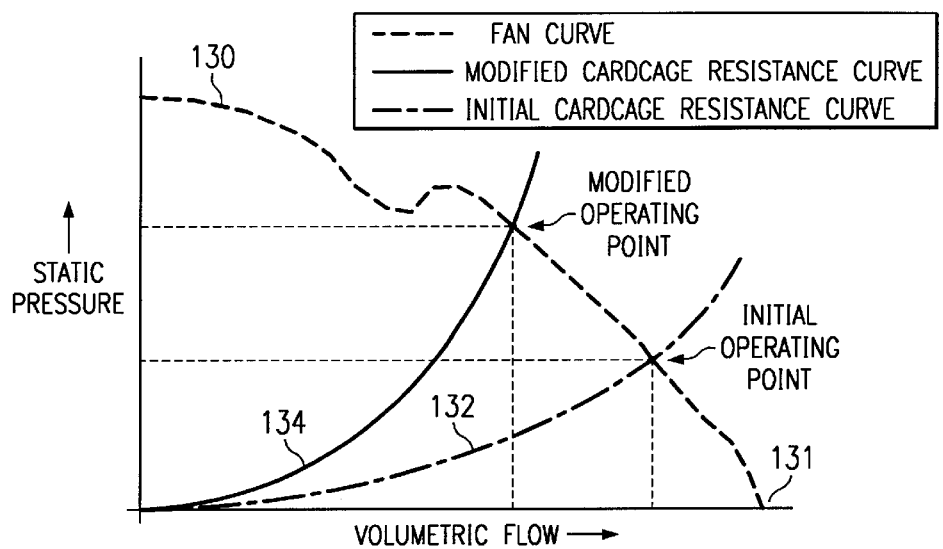
FIG. 13 illustrates a fan's performance curve, cardcage resistance curves, and the resulting operating points.

It is an important aspect of the invention that such modifications and improvements to airflow be made without significantly increasing the cardcage's flow resistance. The allowable increase in the cardcage's flow resistance is dependent upon the performance of the fan selected. Each fan type has a performance curve 130 similar to the one illustrated in FIG. 13. A fan suspended in free space has no flow restrictions and will provide its maximum flow, often termed free delivery, as illustrated at point 131. As geometry is added around the fan, the airflow restrictions increase. For any given configuration of ducts and related geometry a flow resistance curve can be generated, generally referred to as a system resistance curve 132 or 134. The intersection of the fan curve 130 and the system curve 132 defines the operating point of that given configuration. As the system is modified and the system resistance curve increases, the amount of air provided by the fan decreases. For example, by adding an embodiment of a diverter of the present invention, a modified resistance curve 134 is created. By adding a diverter, the static pressure increases while the volumetric airflow decreases. If uniform airflow is obtained using a brute force approach the volumetric airflow will be significantly reduced. This in turn reduces the velocity of the air flowing over the devices. The net result is that while the air is uniform it has been reduced to the point that the system was better off when nothing was done. Therefore, it is an important aspect of the present invention that the diverters do not significantly increase flow resistance. Examples of techniques used to modify the flow restrictions by significantly changing the downstream pressure field include the use of continuous perforated panels or open cell foam. It should be readily understood to a person of ordinary skill in the art that other materials for the diverter that do not significantly increase flow resistance may be used without departing from the scope of the invention.

Figure 14A:
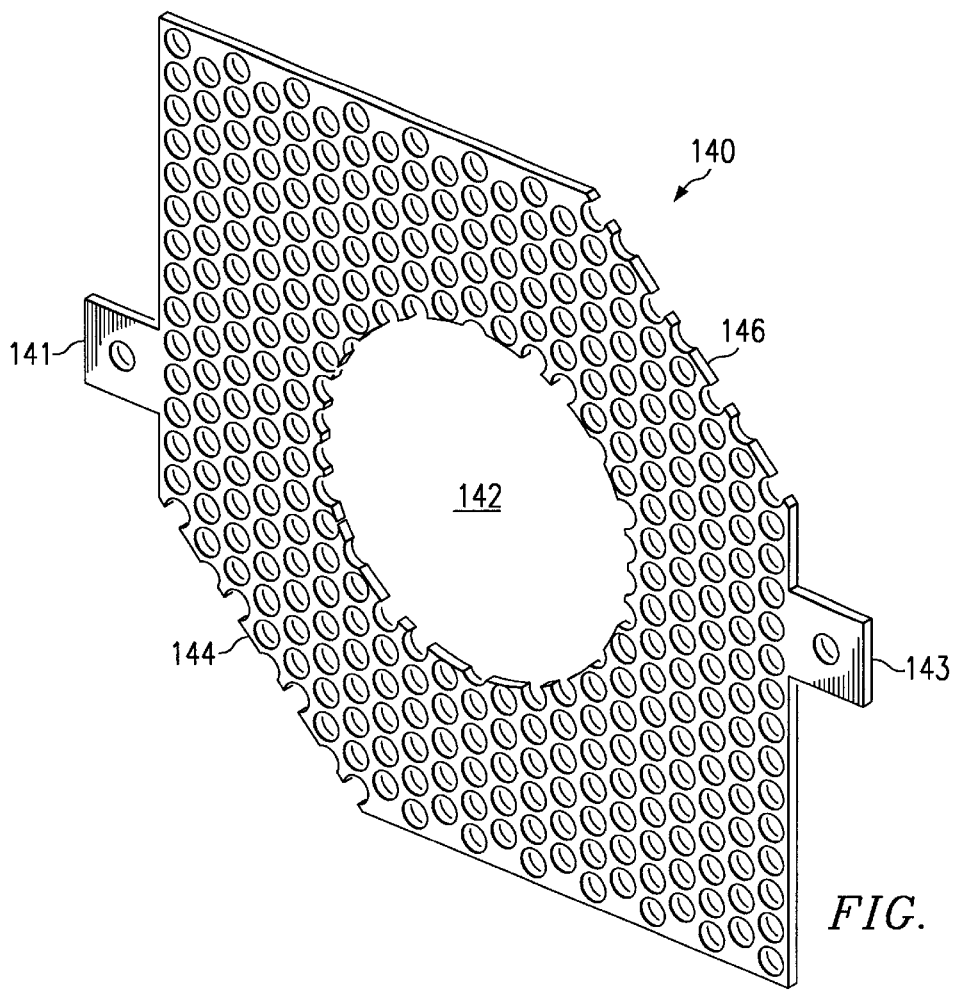
FIGS. 14A and FIG. 14B illustrate different embodiments of the present invention using perforated plates for diverting airflow from an airflow source.
Figure 14B:
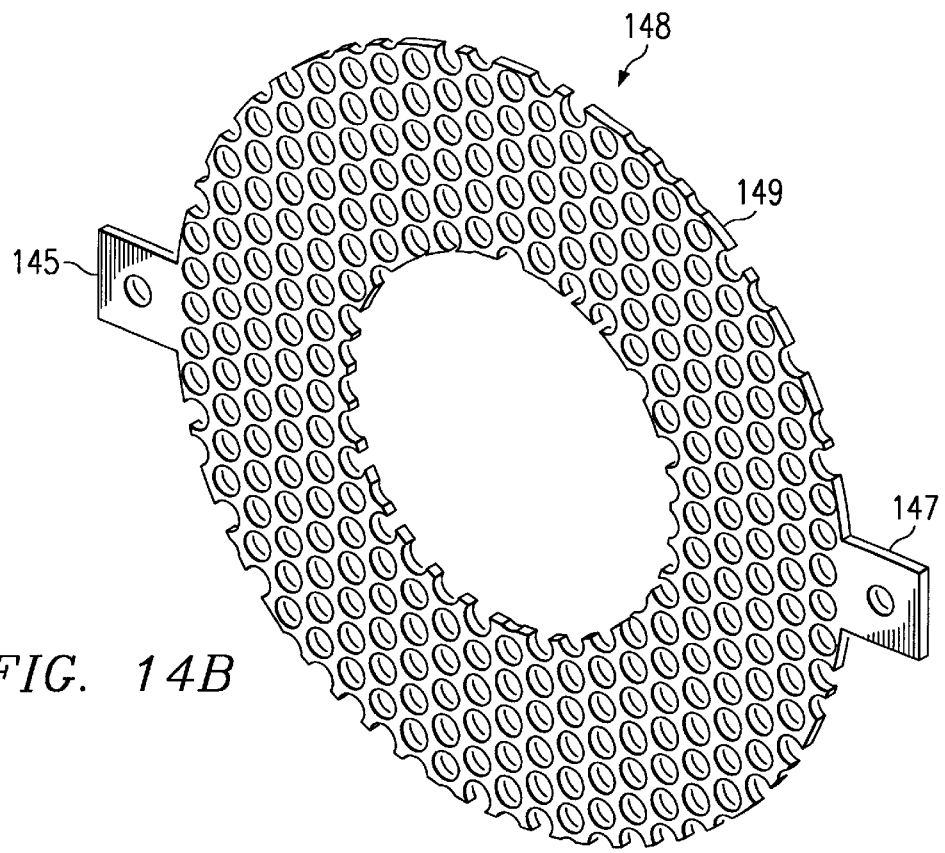

FIG. 14A and FIG. 14B illustrate how continuous perforated panels can be modified to reduce the flow restriction and improve the flow distribution. In one embodiment illustrated in FIG. 14A, a perforated plate 140 approximately the same size of the fan used in the cardcage may be placed between the fan and the cardcage. The plate 140 may be connected via tabs 141 and 143 either directly to the cardcage or to the fan. The center region 142 and two opposite corners 144 and 146 of the perforated plate are removed to allow more airflow in these areas.

In an alternative embodiment illustrated in FIG. 14B, the perforated plate 148 is designed such that only a circular area 149, which corresponds to the fan blast area, remains. This additional resistance provided at the fan blast area causes the air to be more evenly distributed in the hub and corner areas. In addition, the plate 148 may be connected via tabs 145 and 147 either directly to the cardcage or to the fan.

Once again, it should be readily understood that other configurations of the perforated plate or open cell foam may be configured to provide uniform airflow. In addition, other configurations may be used to provide non-uniform airflow, if desired.

Figure 15A:
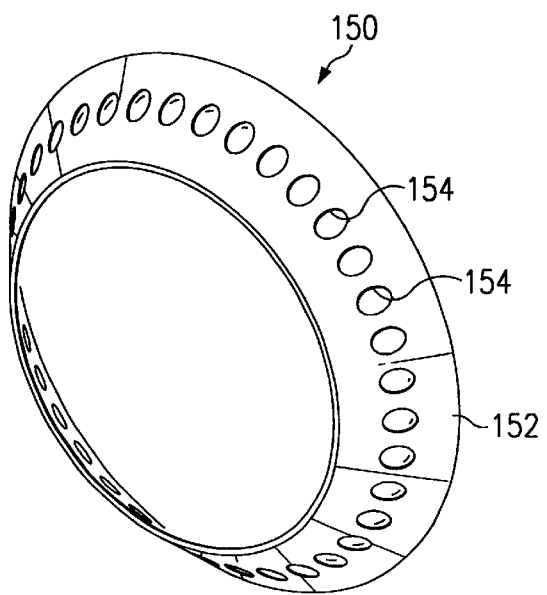
FIGS. 15A and 15B illustrate different embodiments of the present invention using conical ducts for diverting airflow from an airflow source.
Figure 15B:
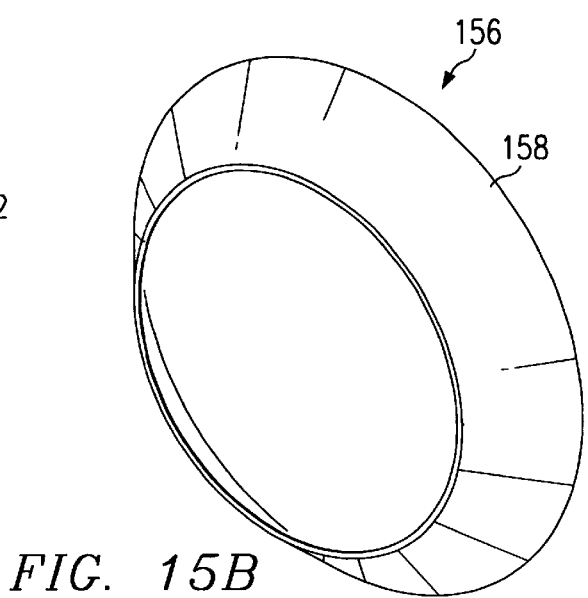

In yet another embodiment, diverters may be used to control airflow profiles by changing the direction of the air velocity vectors as opposed to changing the geometry pressure restrictions. In some cases, the combination of flow restriction and directing vanes result in significant flow improvements. The directing vanes can be a simple flange or a conical duct as illustrated in FIG. 15A and FIG. 15B. FIG. 15A is a conical shaped diverter 150. Air is diverted by the annular ring 152 toward the hub region of an axial fan. A plurality of openings 154 allow some air to flow through the annular ring. FIG. 15B is also a conical shaped diverter 156. In this embodiment, an annular ring 158 diverts air toward an axial fan hub region without any additional openings.

Other configurations may be used such that significant changes in the velocity profile are obtained without a significant increase in the systems airflow resistance. It should be understood that selecting an appropriate embodiment of a diverter of the present invention may require an approach which is empirical in part. Thus, more than one temperature and flow rate survey may be required with resulting flow diverter modifications to attain a desired airflow pattern.

Figure 16B:
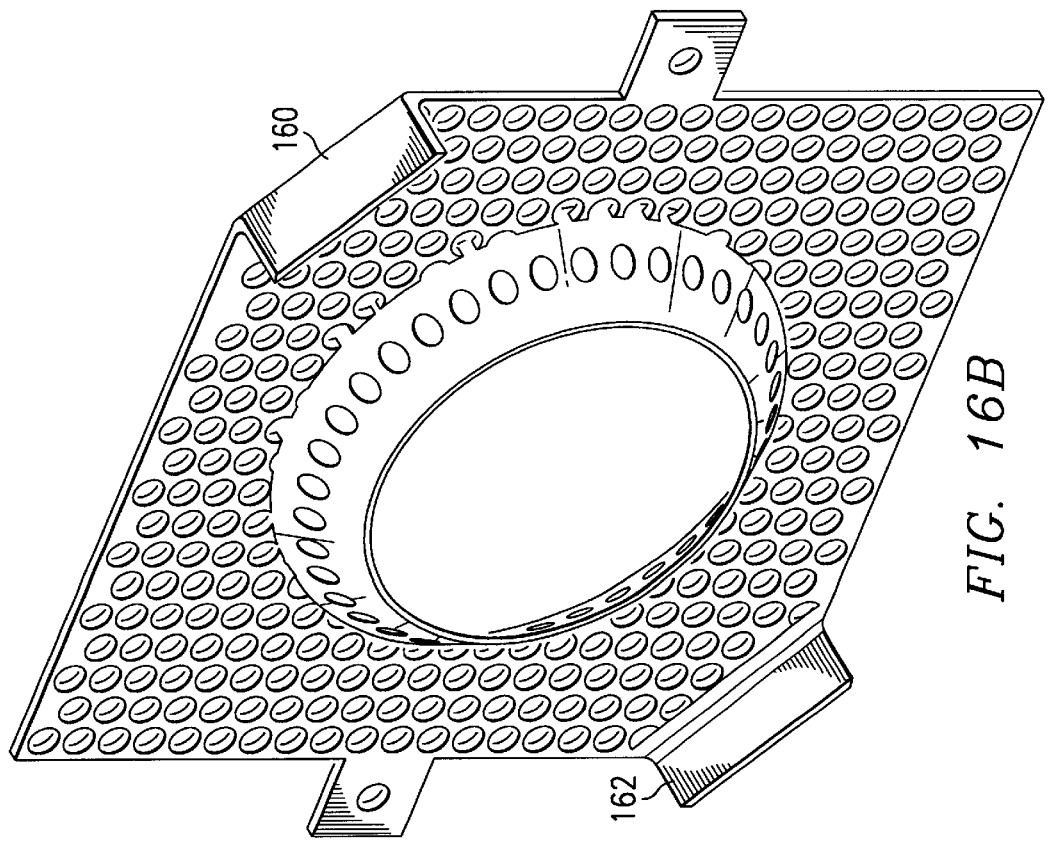
FIGS. 16A and 16B illustrate different embodiments of the present invention using a perforated plate combined with a conical duct for diverting airflow from an airflow source.
Figure 16A:
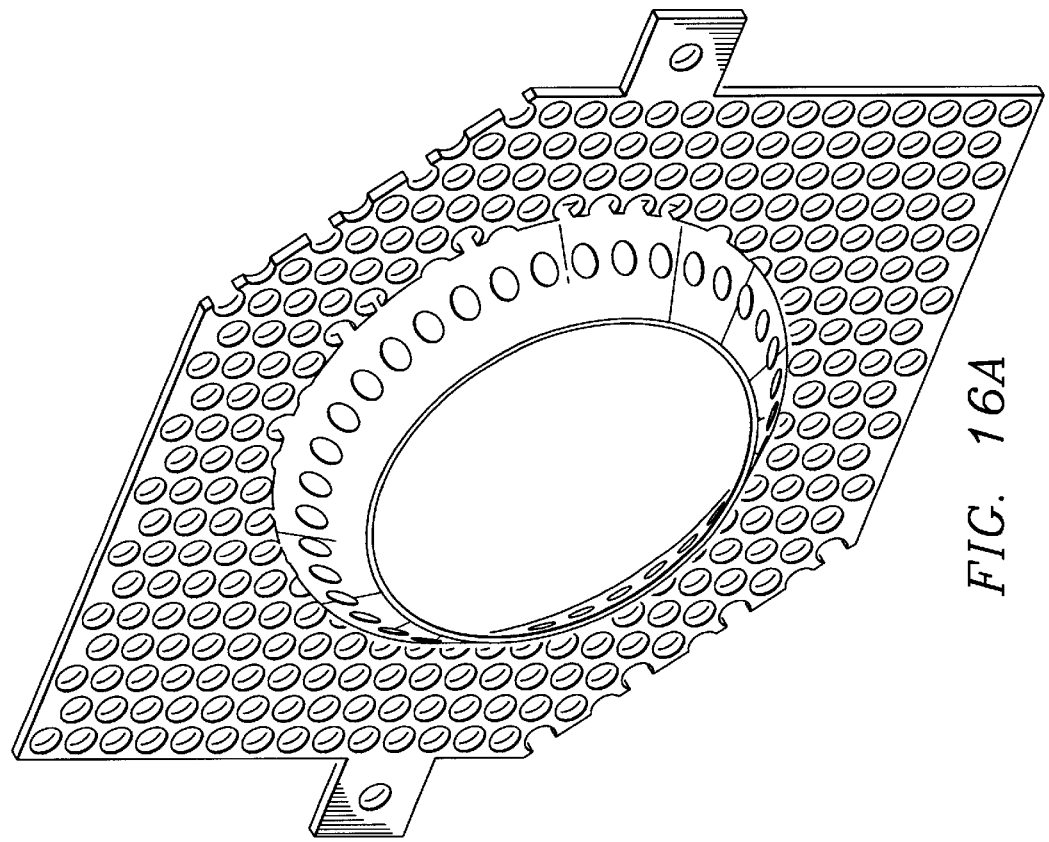

By combining the embodiments described in detail in relation to FIG. 14A and FIG. 15A, an alternate embodiment of the diverter may be obtained as illustrated in FIG. 16A. The perforated plate combined with a conical diverter assist in providing uniform airflow and controlling the flow of air in a cardcage. The conical ducts shown in the figure can be solid or perforated. FIG. 16B illustrates an alternative embodiment of the diverter illustrated in FIG. 16A. The alternate embodiment includes two directing vanes (160 and 162) for directing airflow.

Figure 17:
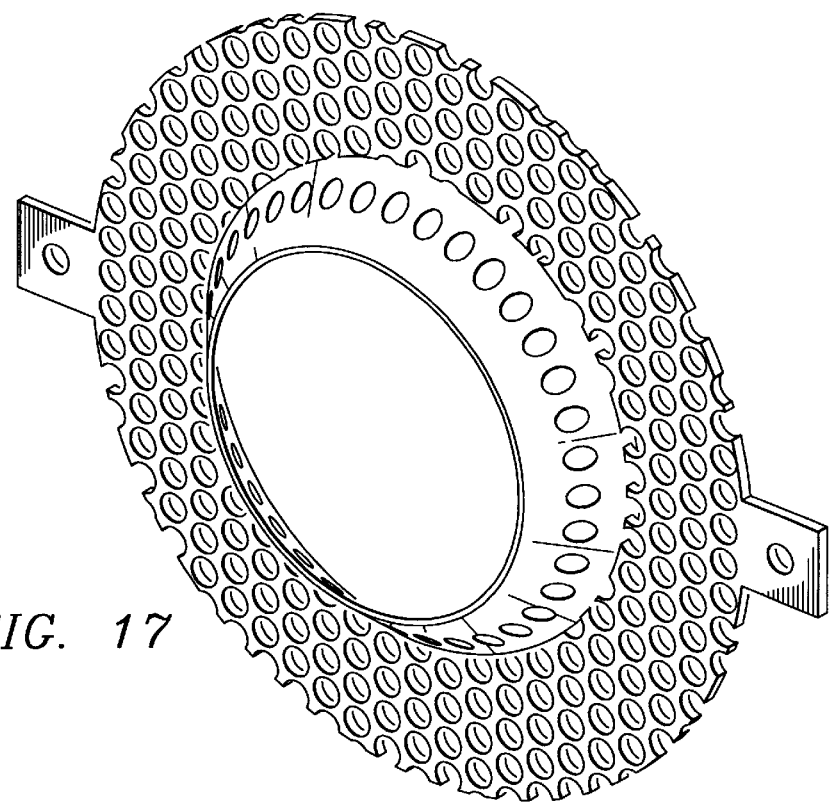
FIG. 17 illustrates another embodiment of the present invention using a perforated plate combined with a conical duct for diverting airflow from an airflow source.

By combining the embodiments described in detail in relation to FIG. 14B and FIG. 15A, an alternate embodiment of the diverter may be obtained as illustrated in FIG. 17. Once again, the conical ducts shown in the figure can be solid or perforated.

Figure 18:
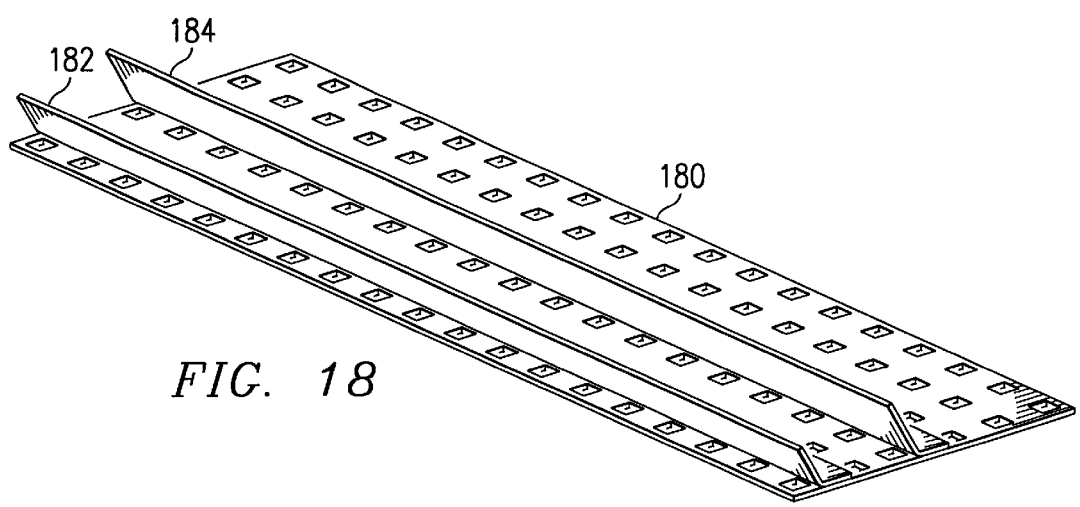
FIG. 18 illustrates an embodiment of the present invention for diverting airflow from an airflow source.
Figure 19A:
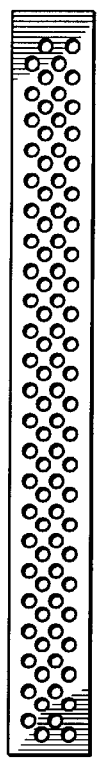
FIGS. 19A–G illustrate several perforated patterns that can be used as different embodiments of the present invention.
Figure 19B:
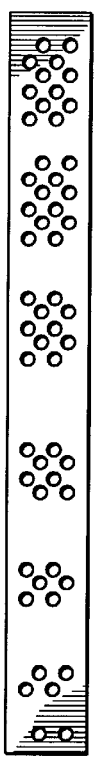
Figure 19C:
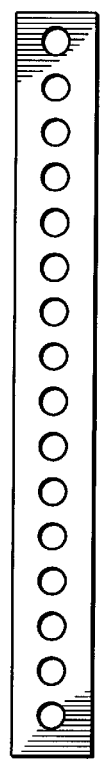
Figure 19D:
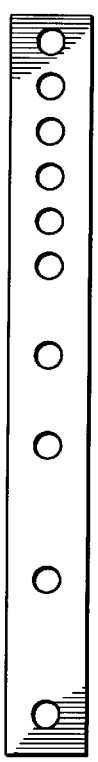
Figure 19E:
Figure 19F:
Figure 19G:
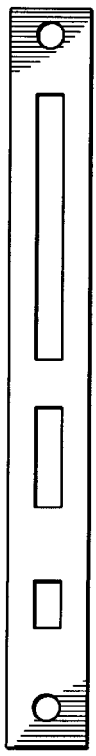

The present invention may also be used to alter airflow from a duplex blower. Although a blower does not have the same type of airflow problems associated with an axial fan, it still may be necessary to alter the airflow. FIG. 18 illustrates a perforated plate 180 with directing vanes 182 and 184 for use with a duplex blower. The perforated plate 180 may be any suitable pattern and may vary from slot to slot in a cardcage. FIG. 19A, FIG. 19B, FIG. 19C, FIG. 19D, FIG. 19E, FIG. 19F, and FIG. 19G illustrates alternate perforations that may be used for obtaining various airflow profiles.

Figure 20:
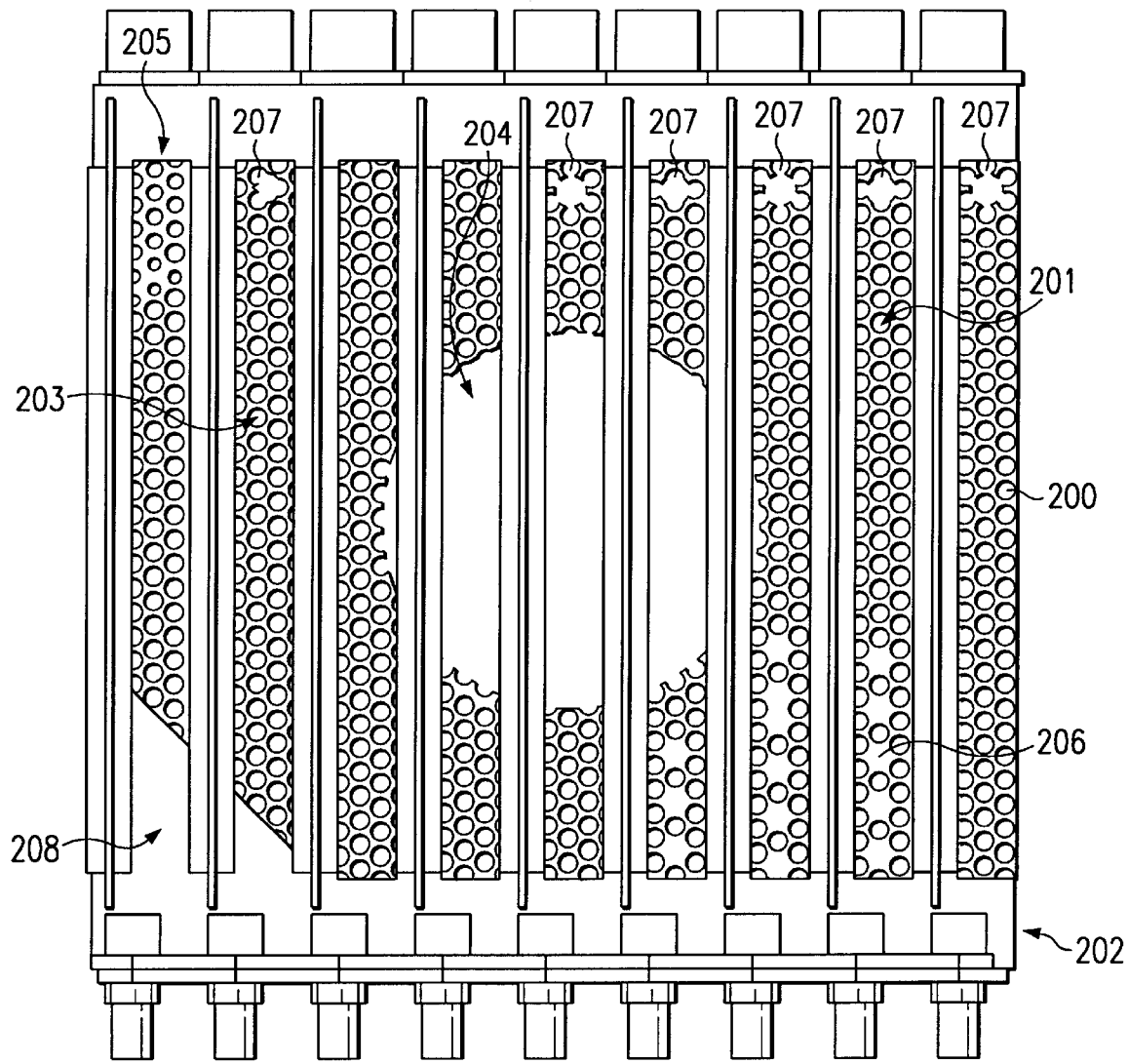
FIG. 20 illustrates an embodiment of the present invention using perforated plates that are integrated with the cardcage.

In all of the disclosed embodiments, the diverter may be either attached or placed outside the cardcage entrance or integrated with the cardcage. FIG. 20 shows an alternate application specific design of a perforated plate 200 that is integrated into the cardcage 202. The open center region 204 increases airflow downstream from the fan hub. The open corner region 208 increases airflow in the cardcage corners. Areas of dense perforation, including regions 201 and 203, and areas of a reduced number of perforation, including regions 205 and 206, help redistribute air from corner regions to low flow regions. Locations of reduced restrictions at the top of the plate, region 207, provide the local flow requirements for the corresponding area.

Based on the foregoing, it should be readily understood that any combination of perforated plates, restrictions, and directing vanes may be used to alter airflow from an airflow source. In addition, these devices may be used to create specific unbalanced flow within the slots of a cardcage, to create uniform flow at the entrance to a cardcage, or to compensate for fan and blower blast areas. These plates, restrictions, and directing vanes are typically made of aluminum, stainless steel, or injection molded plastic. However, it should be readily understood that any suitable material may be selected for the diverter.

Figure 21:
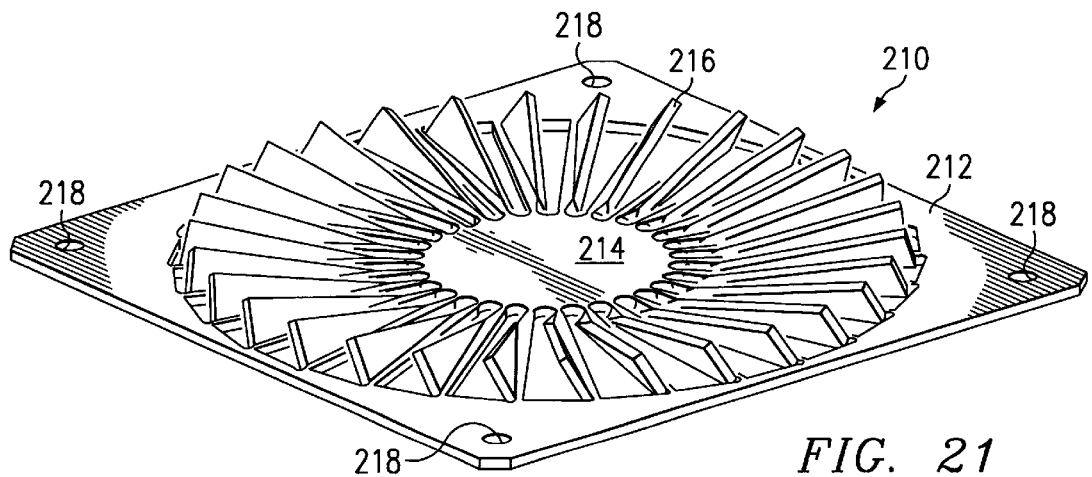
FIG. 21 illustrates an embodiment of a diverter of the present invention.

FIG. 21 illustrates another embodiment of a diverter for compensating for the low output at the center of an axial flow fan. The diverter is configured to be approximately the same size of a standard axial flow fan. The diverter 210 is comprised of a flat frame 212, a solid circular disk 214, and a plurality of vanes 216 extending from the solid circular disk 214 to the flat frame 212. The vanes 216 are configured to counter rotate the airflow from the fan. The diverter 210 may be made of any suitable material, including various metal and plastics and more specifically aluminum and thermoplastic compounds. Several holes 218 are provided to permit the diverter to be directly connected by a suitable fastener to an axial flow fan or duct assembly.

Figure 22:
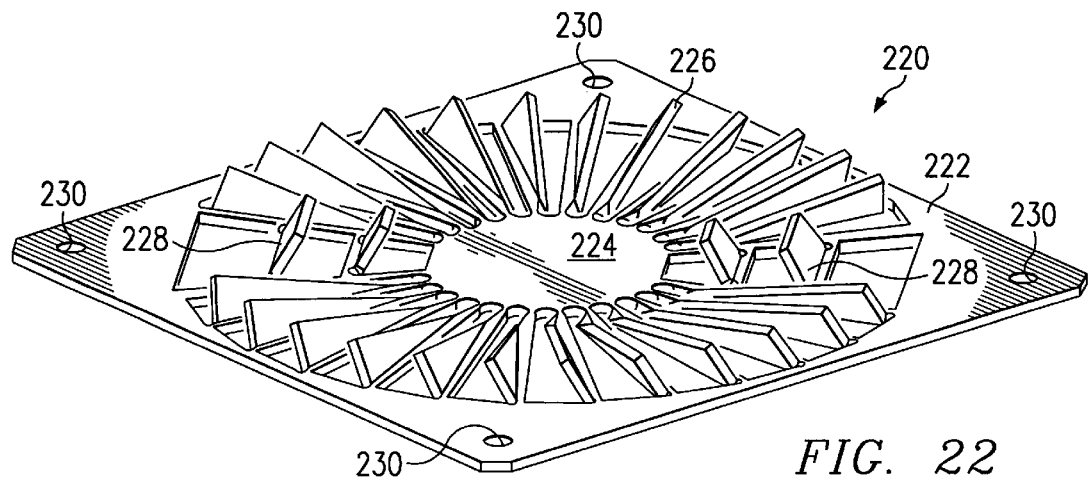
FIG. 22 illustrates an embodiment of a diverter of the present invention.

FIG. 22 shows another alternate design of a diverter. As with the diverter in FIG. 21, the diverter 220 includes a flat frame 222, a solid circular disk 224, and a plurality of vanes 226 extending radially from the solid circular disk 224 to the flat frame 222. Additional vanes 228 are provided concentric with the solid circular disk. The additional concentric vanes 228 direct air towards the center of the cardcage in an attempt to compensate for low center fan flow. The concentric vanes 228 should be placed such that they redirect air from the annular ring in regions that will not impact distribution to other slots. Once again, several holes 230 are provided to permit the diverter to be directly connected by a suitable fastener to an axial flow fan or duct assembly.

All of the methods and/or apparatus disclosed and claimed herein can be made and executed without undue experimentation in light of the present disclosure. While the devices and methods of this invention have been described in terms of specific embodiments, it will be apparent to those of skill in the art that variations may be applied to the methods and/or apparatus and in the steps or in the sequence of steps of the method described herein without departing from the concept, spirit, and scope of the invention. Therefore, all such substitutions and modifications apparent to those skilled in the art are deemed to be within the spirit, scope, and concept of the invention as defined by the appended claims.

For example, the disclosed design techniques and apparatus are not limited to altering airflow in cardcages. The present invention may be used for creating uniform airflow for other applications using fans and centrifugal blowers. Other applications may include, but are not necessarily limited to, providing uniform airflow for heat exchangers.

What is claimed is:

1. A system for controlling the uniformity of airflow for cooling circuit cards in a cardcage comprising:
    an airflow source configured to create a given airflow profile within the cardcage, the given airflow profile having a first plurality of velocities; and
    at least one airflow diverter positioned between the airflow source and the cardcage, said airflow diverter comprising open cell foam configured to alter the given airflow profile to form a desired airflow profile having a second plurality of velocities; wherein the velocities in the second plurality are more uniform than the velocities in the first plurality.

2. The system of claim 1 wherein the configuration of said diffuser provides reduced airflow restriction where increased airflow achieves the desired airflow profile.

3. The system of claim 1 wherein the configuration of said open cell foam provides increased airflow restriction where decreased airflow achieves the desired airflow profile.

4. The system of claim 1 wherein the configuration of said open cell foam provides increased airflow restriction where decreased airflow achieves the desired airflow profile and decreased airflow restriction where increased airflow achieved the desired airflow profile.

5. A device for altering the flow of air from a fan having a fan hub comprising:
    a flat sheet positioned in the flow of air from the fan said flat sheet comprising:
        a substantially solid circular plate centrally disposed in the flat sheets the circular plate positioned in the area of the fan hub; and
        a plurality of substantially rectangular directing vanes angularly disposed relative to the flat sheet and extending radially from the circular plate of said flat sheet, said plurality of directing vanes configured to reduce undesired flow patterns normally associated with an axial flow fan.

6. The device for altering the flow of air of claim 5, further comprising a plurality of concentric directing vanes positioned from the circular plate to reduce airflow in areas where less airflow achieves the desired airflow and to increase airflow in the vicinity of the fan hub.

7. The device for altering the flow of air of claim 5, wherein said device is made of metal.

8. The device for altering the flow of air of claim 5, further comprising a plurality of substantially rectangular directing vanes angularly disposed relative to the flat sheet and concentric to said substantially solid circular plate.

9. A method to distribute airflow to create a substantially balanced airflow within the slots of a cardcage for controlling the temperatures of circuit cards arranged in the cardcage comprising:
    passing a stream of coolant gas past and between the circuit boards in the cage;
    ascertaining the temperatures and flow rates of the gas at a three-dimensional matrix of locations generally throughout the cage; and modifying the flow pattern of the stream of gas entering the cage to minimize variations in such temperature.

10. A system for distributing airflow to create substantially balanced flow within the slots of a cardcage supporting one or more circuit cards, comprising:

an electronic enclosure;

a cardcage mounted at one end of the electronic enclosure, the cardcage supporting one or more circuit cards;

a fan mounted in the electronic enclosure and creating an airflow in the direction of the cardcage; and one or more airflow diverters positioned between the fan and the cardcage in the airflow, the one or more airflow diverters having a flow distribution pattern to create substantially balanced flow within the cardcage without a substantial increase in airflow resistance and distribute the airflow substantially uniformly past each of the one or more circuit cards.

11. The system for distributing airflow to create substantially balanced flow within the slots of a cardcage as set forth in claim 10 wherein the one or more airflow diverters comprise a plurality of diverters sequentially mounted between the fan and the cardcage.

12. The system for distributing airflow to create substantially balanced flow within the slots of a cardcage as set forth in claim 10 wherein the one or more airflow diverters comprises perforated plates having a perforation pattern varying in density to impart substantially uniform airflow passing between each of the one or more circuit cards.

13. The system for distributing airflow to create substantially balanced flow within the slots of a cardcage as set forth in claim 10 wherein the one or more airflow diverters comprises a substantially circular perforated plate having a substantially circular open center.

14. The system for distributing airflow to create substantially balanced flow within the slots of a cardcage as set forth in claim 10 wherein the one or more airflow diverters comprises a perforated plate in combination with a conical diverter.

15. The system of claim 10, wherein said airflow diverter comprises a perforated panel having an opening positioned centrally therein, said airflow diverter being further configured to allow airflow to reach opposing corners of the cardcage in a greater amount than reaches the other opposing corners of the cardcage.

16. The system of claim 10, wherein said airflow diverter comprises a perforated panel having a shape corresponding to the blast area of the airflow source.

17. The system of claim 10, wherein one of the one or more airflow diverters comprises a perforated panel having an opening positioned centrally therein, said airflow diverter being further configured to allow airflow to reach opposing corners of the cardcage in a greater amount than reaches the other opposing corners of the cardcage, and wherein a second of the one or more airflow diverters comprises a conical shape.

18. The system of claim 10, wherein one of the one or more airflow diverters comprises a perforated panel having at least one directing vane extending away from one surface of said perforated panel, and wherein a second of the one or more airflow diverters comprises a conical shape.

19. The system of claim 10, wherein one of the one or more airflow diverters comprises a perforated panel having a shape corresponding to the blast area of the airflow source, and wherein a second of the one or more airflow diverters is conical in shape.

20. The system of claim 10, wherein the one or more airflow diverters comprise perforated panels.

21. A method for distributing airflow to create substantially balanced flow within the slots of a cardcage supporting one or more circuit cards, comprising:

providing an airflow directed to the one or more circuit cards supported in the cardcage;

altering the pattern of the airflow prior to entering the cardcage to form an airflow distribution pattern to create substantially balanced flow within the slots of a cardcage passing each of the one or more circuit cards supported in the cardcage; and passing the altered pattern of airflow between each of the one or more circuit cards in a uniform direction to provide substantially balanced airflow having uniform airflow direction and magnitude between each of the one or more circuit cards supported in the cardcage.

22. The method for distributing airflow to create substantially balanced flow as set forth in claim 21 wherein altering the pattern of air flow comprises:

positioning one or more flow diverters between a source of airflow and the cardcage to modify flow patterns to provide balanced airflow with uniformity of airflow direction and magnitude between each of the one or more circuit cards supported in the cardcage.

23. The method for distributing airflow to create substantially balanced flow as in claim 21 wherein altering the pattern of airflow from an airflow source comprises modifying the direction of air velocity vectors from the airflow source.

24. The method for distributing airflow to create substantially balanced flow as in claim 21 wherein altering the pattern of airflow from an airflow source comprises mounting a first airflow diverter having a minimum effect on increased airflow resistance between the airflow source and the cardcage; and mounting a second diverter between the first diverter and the cardcage, said second diverter also having a minimum effect on an increase of airflow resistance.

25. A method for distributing airflow to create substantially balanced flow as in claim 21 wherein the airflow source comprises an axial flow fan and altering the pattern of airflow from the airflow source comprises directing airflow toward the hub region of the fan.

26. The method for distributing airflow to create substantially balanced flow as in claim 21 wherein altering the pattern of airflow from an airflow source comprises:

mounting a substantially circular shaped perforated airflow diverter between the airflow source and the cardcage, said airflow diverter further comprising a substantially circular open center section.

27. The method for distributing airflow to create substantially balanced flow as in claim 21 wherein altering the pattern of airflow from an airflow source comprises:

mounting an airflow diverter having a conical shaped surface between the airflow source and the cardcage, said airflow diverter having a substantially circular open section and the conical surface comprises one or more flow passages.

28. The method for distributing airflow to create substantially balanced flow as set forth in claim 21 wherein altering the pattern of airflow from an airflow source comprises:

mounting an airflow diverter comprising a perforated flat surface combined with a conical shaped center section between the airflow source and the cardcage.

* * * * *

UNITED STATES PATENT AND TRADEMARK OFFICE
CERTIFICATE OF CORRECTION

PATENT NO.    : 6,280,317 B1
DATED         : August 28, 2001
INVENTOR(S)   : Mark B. Przilas et al.

It is certified that error appears in the above-identified patent and that said Letters Patent is hereby corrected as shown below:

<u>Title page,</u>
Item [75] Inventors, after "Rowlett", insert -- Robert A. Bruce, Greenville --; and after "Greenville", delete "both", and insert -- all --.

<u>Column 4,</u>
Line 54 delete "Fig. 6", and insert -- Fig. 8 --.

<u>Column 7,</u>
Line 48 after "bottom", delete "comers", and insert -- corners --.

<u>Column 10,</u>
Line 17 after "opposite", delete "comers", and insert -- corners --.

<u>Column 12,</u>
Line 40 after "sheets", insert -- , --.

<u>Column 13,</u>
Line 44 after "opposing", delete "comers", and insert -- corners --.
Line 51 delete "comers", and insert -- corners --.

Signed and Sealed this

Fourth Day of June, 2002

*Attest:*

*Attesting Officer*

JAMES E. ROGAN
*Director of the United States Patent and Trademark Office*